United States Patent [19]  [11] 4,146,851
Dempsey et al.  [45] Mar. 27, 1979

[54] ACOUSTIC SURFACE WAVE DEVICE

[75] Inventors: Martin E. Dempsey, Acton; Ching-Wen Lee, Lexington, both of Mass.

[73] Assignee: GTE Laboratories Incorporated, Waltham, Mass.

[21] Appl. No.: 810,376

[22] Filed: Jun. 23, 1977

[51] Int. Cl.² .................. H03H 9/26; H03H 9/32; H03H 9/30; H01L 41/10
[52] U.S. Cl. ................................. 333/194; 333/195; 333/153
[58] Field of Search ............... 333/30 R, 72, 71; 310/313

[56] References Cited

U.S. PATENT DOCUMENTS

| 3,662,293 | 5/1972 | De Vries | 333/30 R |
| 3,727,155 | 4/1973 | De Vries | 333/72 |
| 4,038,614 | 7/1977 | Chapman et al. | 333/30 R |
| 4,048,594 | 9/1977 | Weglein | 333/30 R X |

Primary Examiner—Alfred E. Smith
Assistant Examiner—Marvin Nussbaum
Attorney, Agent, or Firm—David M. Keay

[57] ABSTRACT

A sidestepping acoustic surface wave filter device employing a 3 dB multistrip coupler between the input transducer and the offset output transducer. A reflector is located across the track associated with the input transducer in the region adjacent to the output transducer. The 3 dB coupler causes the output transducer and the reflector to receive equal acoustic surface wave energy. The reflector is designed so that the energy reflected by it is equal to the energy returned by the output transducer. Phase shifts produced in the returning acoustic surface waves by the coupler cause the returning acoustic surface waves to be suppressed in the track associated with the input transducer. Thus, triple transit signals are avoided.

7 Claims, 4 Drawing Figures

ACOUSTIC SURFACE WAVE DEVICE

BACKGROUND OF THE INVENTION

This invention relates to acoustic surface wave devices. More particularly, it is concerned with acoustic surface wave devices of the sidestepping type for use as filters.

Acoustic surface wave devices employing piezoelectric materials having suitable properties for propagating acoustic surface waves and having transducers for launching and receiving acoustic surface waves in the material are well-known. Typically, the transducers are arrays of interleaved conductive electrodes deposited on the material. In response to electrical signals an input or transmitting transducer launches acoustic surface waves along a predetermined track on the surface of the material. An output or receiving transducer detects the acoustic surface waves and generates electrical signals in response thereto. Typically acoustic surface wave devices have been employed as delay lines and as filters. Because of the frequency response which can be obtained from a device by suitably designing the configuration of the transducer electrodes, particularly desirable bandpass characteristics can be achieved such as that required of an intermediate frequency filter for use in television receivers.

In the development of acoustic surface wave devices for use as filters various problems have been encountered. For example, in addition to the acoustic surface waves, an input transducer also generates bulk waves in the body of the piezoelectric material. Since bulk waves have a longer transit time through the material before reaching the output transducer, they interfere with the proper operation of the device. This problem is avoided, however, with sidestepping type devices in which the input and output transducers are offset on different tracks or propagation paths. A sidestepping device employs a multistrip coupler which is an array of filamentary conductive elements on the surface of the material between the input and output transducers. The coupler transfers surface wave energy, but not bulk wave energy, from the track of the input transducer to the track of the output transducer.

Another significant problem of acoustic surface wave devices is the presence of "triple transit signals" which result from interaction between the input and output tranducers. In response to the receipt of acoustic energy from the input transducer, the output transducer causes a fraction of the energy to be directed back toward the input transducer. The input transducer re-transmits a portion of this energy to the output transducer. Thus, a greatly reduced but nevertheless noticeable echo signal is received by the output transducer. This signal which transits the distance between the input and output transducer three times distorts the electrical signal produced by the output transducer.

Various techniques have been employed to eliminate or reduce the effects of these triple transit signals. Reflections of acoustic energy from the edges of the electrodes of the transducers can be suppressed by using electrodes having two elements of one-eighth wavelength in width and separation in place of single element electrodes of one-quarter wavelength in width and separation. Other techniques have been devised in attempts to reduce the effects due to the regenerative action of the received energy with the transducers. These techniques include the use of unidirectional transducer structures and the use of methods for increasing insertion loss thereby suppressing the triple transit signals to a much greater extent than the primary signal. However, using these techniques incurs increased costs for larger substrates of piezoelectric material, additional terminals and components, or more complicated fabrication procedures, or cause degradation of the operating characteristics of the device.

One proposed solution for the problem of triple transit signals employing a sidestepping acoustic surface wave device is described in U.S. Pat. No. 3,836,876 to Marshall et al. The disclosed device employs a 3 dB multistrip coupler between the tracks of the offset input and output transducers. A second output transducer identical to the primary output transducer is located adjacent to the primary output transducer along the track from the input transducer at the same distance from the coupler as the primary output transducer. The second output transducer is connected to circuit components which are as equivalent as possible to the output circuitry connected to the principal output transducer.

As is well-understood the 3 dB coupler divides the acoustic energy received from the input transducer so that equal energy is propagated along the two tracks to the two output transducers. The two acoustic surface waves are in quadrature with that directed to the primary output transducer leading. Since the two output transducers and their associated circuitry are identical, they propagate back toward the coupler identical signals which are in quadrature. The coupler divides the energy received on each track into equal signals along the two tracks. The changes in phase cause the acoustic surface waves directed toward the input tranducer to be suppressed, and a resulting surface wave is propagated only along the other track to be absorbed by a mass of absorbing material on that track adjacent to the input transducer. This structure while effective in suppressing triple transit signals is more expensive because of the additional terminals and dummy load components required and the additional assembly costs incurred.

SUMMARY OF THE INVENTION

In accordance with the present invention an improved sidestepping acoustic surface wave device is provided. The device includes an acoustic surface wave propagating medium and an input transducer for launching acoustic surface waves along a first propagation path in the medium. A multistrip coupler is interposed across the first propagation path and also across a second propagation path in the medium which is spaced from and parallel to the first propagation path. The multistrip coupler divides the acoustic surface wave power from the input transducer into the first and second propagation paths in quadrature. An output transducer is disposed across the second propagation path for receiving and detecting acoustic surface waves propagated along that path from the multistrip coupler. A reflector is disposed across the first propagation path in a location remote from the input transducer and adjacent to the output transducer. The reflector reflects along the first propagation path toward the multistrip coupler acoustic surface waves which are substantially equal to and in quadrature with the acoustic surface waves propagated along the second propagation path toward the multistrip coupler by the output transducer in response to the acoustic surface waves received from the multistrip coupler. The multistrip coupler combines the in quadrature acoustic surface waves from the reflector and from the output transducer to propagate acoustic surface waves along the second propagation path in the direction away from the output transducer and propagates substantially no acoustic surface waves along the first propagation path toward the input transducer.

Figure 1:
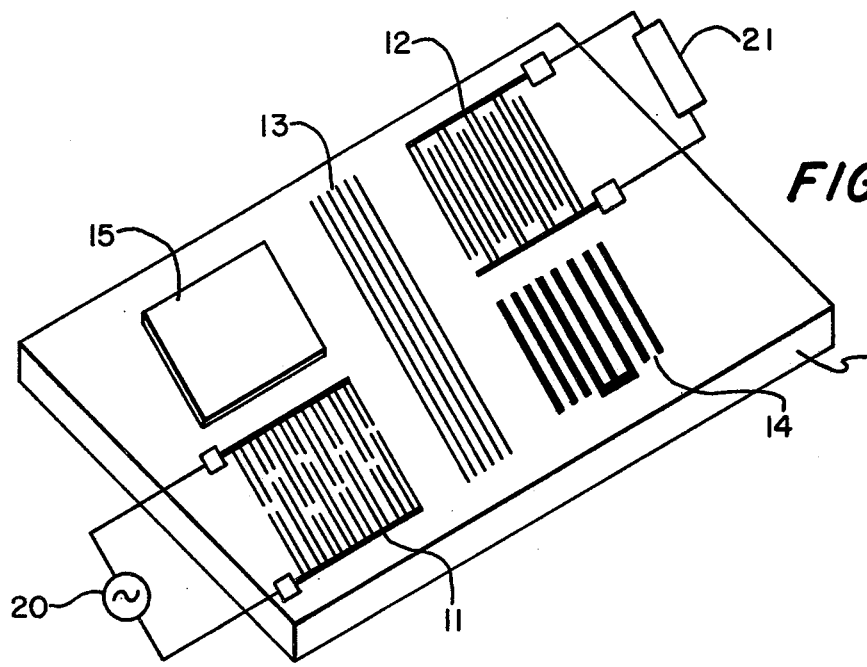
FIG. 1 is a schematic representation of a sidestepping acoustic surface wave device in accordance with the present invention.

It should be noted that FIG. 1 is a schematic representation and thus does not show the configuration, spacing, or number of conductive elements as present in an actual device.

For a better understanding of the present invention, together with other and further objects, advantages, and capabilities thereof, reference is made to the following disclosure and appended claims in connection with the above-described drawings.

DETAILED DESCRIPTION OF THE INVENTION

FIG. 1 is a schematic illustration of a sidestepping acoustic surface wave device in accordance with the present invention which may be used, for example, as an intermediate frequency filter in television receivers. The device is basically similar to well-known sidestepping acoustic surface wave devices as described hereinabove. The device includes a substrate 10 of a suitable acoustic surface wave propagating material, for example, PZT, lithium niobate, or lithium tantalate. An input or transmitting transducer 11 is deposited on the surface of the substrate 10 for launching acoustic surface waves along a first track or propagation path. An output or receiving transducer 12 is located on a second track or propagation path offset from and parallel to the first track. A multistrip coupler 13 is placed between the input and output transducers and is interposed across both the first and second tracks. The multistrip coupler is a 3 dB coupler which, as is well-known, divides the received energy so that equal acoustic surface waves are propagated along the two tracks. The two signals are in quadrature with that on the second track leading by 90°. In accordance with the present invention a reflector 14 is located across the first track on the side of the coupler 13 remote from the input transducer 11 and adjacent to the output transducer 12. A quantity of acoustic surface wave absorbing material 15 is located across the second track remote from the output transducer 12 and adjacent to the input transducer 11. A source of electrical signals 20 is applied to the input transducer 11, and the output transducer 12 is connected to a load 21.

The input transducer 11, represented schematically in FIG. 1, includes two sets of interleaved conductive electrodes deposited on the surface of the substrate of wave propagating material 10. As indicated in the figure each electrode consists of two conductive elements and the electrodes are appropriately apodized and also weighted as to width and separation to produce a desired frequency response. The source of electrical signal energy 20 is connected across the two sets of electrodes. The input transducer 11 converts electrical energy from the source 20 to mechanical acoustic surface waves which propagate along the first track in the medium in a direction transverse to the direction in which the electrodes extend.

The output transducer 12, as represented in FIG. 1, also includes two sets of interleaved electrodes, each electrode being a double element. The electrodes are illustrated as being of equal length, although they may also be weighted. As represented, the width of each element and the spacing between adjacent elements is one-eighth of the wavelength of the resonant frequency of the device. The output transducer 12 receives the acoustic surface waves propagated toward it along the second track, detects them, and converts them into electrical signals which are applied to the load 21 connected across the two sets of electrodes.

The 3 dB multistrip coupler 13 is an array of parallel conductive filamentary elements which are electrically isolated from each other and extend across both the first and second tracks. The 3 dB coupler 13 receives the acoustic surface wave energy from the input transducer 11 along the first track. The 3 dB coupler, in effect, splits the energy received and causes equal signals to be propagated along the first and second tracks toward the reflector 14 and the output transducer 12, respectively. These surface waves are in quadrature with that along the second track to the output transducer 12 leading by 90°.

The reflector 14 is also an arrangement of an array of conductive elements or strips on the surface of the material 10. In the specific embodiment represented by FIG. 1 the elements are individually of width equal to one-fourth of the wavelength of the resonant frequency of the device and are spaced apart by one-fourth of a wavelength. A group of the elements in the center of the reflector are electrically connected together at one end and the remainder are each electrically isolated. Since the coupler is bi-directional any acoustic surface wave energy received on the first or second tracks from the reflector 14 or output transducer 12 is divided and energy is propagated along the two tracks in the direction away from the reflector or output transducer. The signal energy shifted from one track to the other leads by 90°.

The acoustic surface wave filter device as illustrated operates in accordance with well-understood phenomena to process electrical signals from the source 20 and apply the resulting electrical output signals to the load 21. The electrical input signals are applied across the two sets of electrodes of the input transducer 11 which launches acoustic surface waves along the first track in accordance with a particular frequency response as determined by the configuration of the transducer electrodes. These waves are intercepted by the 3 dB coupler 13. The multistrip coupler divides the energy received and propagates acoustic surface waves of equal energy along both the first and second tracks toward the reflector 14 and output transducer 12. The waves are in quadrature with those along the second track leading by 90°.

The acoustic surface waves propagated along the second track are received and detected by the output transducer 12. The output transducer 12 operates in the well-known manner to convert the acoustic surface wave energy to electrical signals which conform to a predetermined frequency response determined by the structure of the input and output transducers 11 and 12. The resulting electrical signals are applied to a load 21. In this manner the filter device operates to produce a desired response to an input signal thereby providing appropriately filtered output signals.

As is well-known the output transducer 12 reacts with the received acoustic energy to propagate a fraction of the received energy back toward the multistrip coupler 13. A portion of the energy is returned by reflection from the edges of the conductive electrode elements. As is well-understood, by employing double elements having a width and separation of one-eighth of a wavelength, the reflected waves are in phase opposition and, therefore, suppressed. Acoustic surface waves produced by regenerative action of the output transducer 12 with the received energy are not suppressed by the use of double elements, however, and these waves are transferred by the coupler 13 to the first track and propagated toward the input transducer 11. Without the presence of the reflector 14, as will be explained hereinbelow, the regenerated wave would impinge on the input transducer 11, and be redirected to the output transducer 12 as a triple transit signal.

The reflector 14 is designed so as to nullify the effects of the regenerated acoustic surface waves from the output transducer 12 and thus eliminate the problems of triple transit signals. The reflector 14 reflects acoustic surface waves received from the multistrip coupler 13 back to the multistrip coupler 13. The design of the reflector 14 is such that the reflected waves are substantially identical to those produced by regenerative action of the output transducer 12. The output transducer 12 and the reflector 14 are both positioned on the substrate 10 so that the peak of reflection of each is at the same distance from the coupler 13. Thus, the return waves reaching the coupler 13 are equal and in quadrature with those on the second track from the output transducer 12 leading by 90°.

The 3 dB coupler 13 divides the energy from the output transducer 12 and from the reflector 14 so that equal energy from each is propagated along the two tracks. The acoustic surface waves transferred to the first track from the output transducer 12 are shifted in phase and, therefore, are 180° out of phase with the energy propagated on the first track from the reflector 14. Since the two waves are equal and 180° out of phase, they cancel each other thereby suppressing any return signals to the input transducer 11. The acoustic surface waves propagated along the second track in response to the return waves from the output transducer 12 and reflector 14 are absorbed by the pad of acoustic surface wave energy absorbing material 15.

As explained hereinabove the reflector 14 is designed to return to the coupler 13 acoustic surface waves equal to those produced by regenerative action of the output transistor 12 with the received acoustic surface waves. The acoustic regeneration $P_{11}$ of the output transducer is calculated from the following expression $$P_{11}(f_o) = -10 \log_{10}\{Q_L^2/((Q_L+Q_R)^2 + \delta Q_L^2 Q_R^2)\}$$

where $$Q_L = 2\pi f_o C_T R_L$$

and $$Q_R = \tfrac{1}{2}\pi f_o C_T R_a$$

and $f_o$ is the synchronous frequency, $C_T$ is the transducer capacitance, $R_L$ is the load resistance, $R_a$ is the radiation resistance, and $\delta = 0$ or 1 for tuned or untuned transducers, respectively.

The reflection $|RF|_c$ at the center or synchronous frequency from conductive elements of the reflector 14 of $\tfrac{1}{4}$ wavelength in width and spaced apart by $\tfrac{1}{4}$ wavelength is $$|RF|_c = (1-\alpha/\epsilon') \tanh(N\epsilon')$$

where $\alpha$ is the loss in the reflector, N is the number of reflecting elements, and $\epsilon' = |\epsilon \sin(\pi t)|$. $\epsilon$ is the impedance discontinuity and t is the fraction of each reflector period occupied by the region of perturbed acoustic impedance. For aluminum strips on YZ lithium niobate, $\epsilon$ and $\alpha$ are for shorted elements $$\epsilon_{short} = -0.015 \pm 0.001$$

for unconnected or electrically open elements $$\epsilon_{open} = +0.011 \pm 0.001$$

and $$\alpha = 5.8 \times 10^{-4}$$

$\epsilon$ can be treated as a constant for aluminum thicknesses ranging from 2,000 to 14,000 Å. Thus, a reflector 14 can be designed to compensate for the acoustic regeneration produced by the output transducer 12 together with the load 21.

In one specific embodiment devices were fabricated in accordance with the present invention for use as intermediate frequency filters in television receivers having a frequency response in accordance with European standards. The device employed a substrate of YZ lithium niobate and the conductive elements were of aluminum 2,000 Å thick. The output transducer 12 was fabricated of 36 double element electrodes and had a 0.078 inch aperture. The load resistance $R_L$ was 1500 ohms, the measured value of $C_T$ was 11.16 pf, and the measured value of $R_a$ was 91.2 ohms. The acoustic regeneration of the output transducer at the center frequency of 36.15 MHz was $P_{11}(f_o) = -13.673$ dB. Using this value for reflection $|RF|_c$, the number of conductive elements for the reflector was calculated to be 4 shorted and 14 open. The conductive elements were arranged in an array with the 4 elements in the center connected together at one end with 7 open electrically isolated elements on each side.

Figure 2:
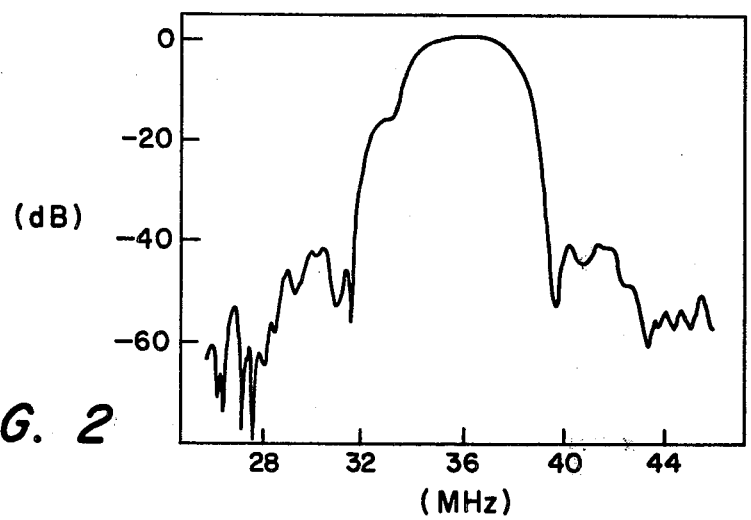
FIG. 2 is a curve illustrating the frequency response of a typical television intermediate frequency filter in accordance with the present invention.
Figure 3A:
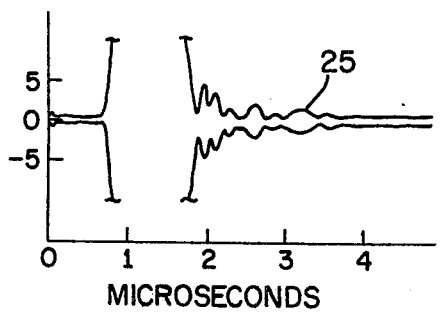
FIG. 3A is a curve illustrating the impulse response of the device of FIG. 1 in accordance with the present invention.
Figure 3B:
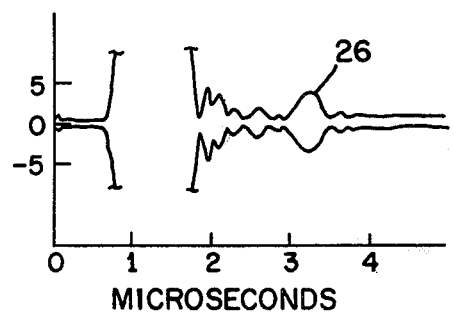
FIG. 3B is a curve illustrating the impulse response of a device which is similar but does not employ a reflector.

The curve of FIG. 2 illustrates the frequency response obtained from devices in accordance with the specific embodiment as described. FIG. 3A illustrates the response of a device in accordance with the specific embodiment described to a single narrow pulse. FIG. 3B illustrates the response of a device which was essentially similar except that the reflector was not present. The transit time of each acoustic surface wave through the propagating medium from the input transducer to the output transducer was approximately 1.1 microsecond as indicated by the center of the primary output pulse. Thus, the triple transit signal produced by each pulse occurred at approximately 3.3 microseconds as shown at points 25 and 26 in FIGS. 3A and 3B, respectively. The suppression of the triple transit signal in the device without the reflector (FIG. 3B) was approximately 34 dB. Although the presence of other low level spurious responses with approximately the same delay somewhat masked the full effects, the suppression was at least 43 dB in the device with the reflector in accordance with the present invention (FIG. 3A).

Thus, while there has been shown and desribed what is considered a preferred embodiment of the present invention, it will be obvious to those skilled in the art that various changes and modifications may be made therein without departing from the invention as defined by the appended claims.

What is claimed is:

1. A sidestepping acoustic surface wave device comprising
    an acoustic surface wave propagating medium;
    an input transducer for launching acoustic surface waves along a first propagation path in said medium, the input transducer comprising two sets of interleaved electrodes disposed on the surface of the acoustic surface wave propagating medium with the electrodes extending transversely to the first propagation path;
    a multistrip coupler interposed across said first propagation path and across a second propagation path in said medium spaced from and parallel to said first propagation path for dividing the acoustic surface wave power from the input transducer into the first and second propagation paths in quadrature, the multistrip coupler being a 3 dB coupler and comprising an array of spaced filamentary conductors disposed on the surface of the acoustic surface wave propagating medium with the conductors extending transversely across the first and second propagation paths;
    an output transducer disposed across said second propagation path for receiving and detecting acoustic surface waves propagated along the second propagation path from the multistrip coupler, the output transducer comprising two sets of interleaved electrodes disposed on the surface of the acoustic surface wave propagating medium with the electrodes extending transversely to the second propagation path; and
    a reflector disposed across said first propagation path remote from the input transducer and adjacent to the output transducer for reflecting along the first propagation path toward the multistrip coupler acoustic surface waves substantially equal to and in quadrature with the acoustic surface waves propagated along the second propagation path toward the multistrip coupler by the output transducer in response to the acoustic surface waves received from the multistrip coupler, the reflector comprising an array of spaced conductive elements disposed on the surface of the acoustic surface wave propagating medium with the elements extending transversely to the first propagation path;
    said multistrip coupler being operable to combine the in quadrature acoustic surface waves from the reflector and from the output transducer to propagate acoustic surface waves along the second propagation path in the direction away from the output transducer and to propagate substantially no acoustic surface waves along the first propagation path toward the input transducer.

2. A sidestepping acoustic surface wave device in accordance with claim 1 wherein
    said reflector is operable to reflect along the first propagation path toward the multistrip coupler acoustic surface waves substantially equal to and in quadrature with the acoustic surface waves produced by regenerative action of the output transducer in response to the acoustic surface waves received from the multistrip coupler and propagated along the second propagation path toward the multistrip coupler.

3. A sidestepping acoustic surface wave device in accordance with claim 2 wherein
    several of the conductive elements of said reflector are electrically connected to each other at one end; and
    the remainder of the conductive elements of said reflector are electrically isolated from each other.

4. A sidestepping acoustic surface wave device in accordance with claim 3 wherein
    each of said electrodes of said output transducer comprises two spaced electrode elements;
    each element having a width of approximately one-eighth the wave length of the resonant frequency and being spaced from an adjacent electrode by approximately one-eighth the wavelength of the resonant frequency.

5. A sidestepping acoustic surface wave device in accordance with claim 4 including
    acoustic surface wave absorbing material disposed across the second propagation path remote from the output transducer and adjacent to the input transducer for absorbing acoustic surface waves propagated therealong from the multistrip coupler.

6. A sidestepping acoustic surface wave device in accordance with claim 5 wherein
    each of the conductive elements of the reflector has a width of approximately one-fourth the wavelength of the resonant frequency of the output transducer and is spaced from the adjacent conductive element by approximately one-fourth the wavelength of said resonant frequency; and
    the several of the conductive elements electrically connected to each other are located centrally of the array of conductive elements.

7. A sidestepping acoustic surface wave device in accordance with claim 6 wherein
    the two sets of electrodes of said input transducer are discretely apodized interleaved electrodes of weighted width and spacing for launching acoustic surface waves having a predetermined frequency response; and
    the output transducer has a predetermined frequency response to acoustic surface waves received thereby;
    the predetermined frequency responses of the input transducer and the output transducer causing the acoustic surface wave device to have the frequency response of an intermediate frequency filter for television receivers.

* * * * *